United States Patent [19]

Takahashi

[11] Patent Number: 4,965,647
[45] Date of Patent: Oct. 23, 1990

[54] VERTICAL MOS FIELD EFFECT TRANSISTOR HAVING A HIGH WITHSTAND VOLTAGE AND A HIGH SWITCHING SPEED

[75] Inventor: Mitsuasa Takahashi, Tokyo, Japan

[73] Assignee: NEC Corporation, Tokyo, Japan

[21] Appl. No.: 355,855

[22] Filed: May 17, 1989

Related U.S. Application Data

[63] Continuation of Ser. No. 156,152, Feb. 16, 1988, abandoned.

[30] Foreign Application Priority Data

Feb. 16, 1987 [JP] Japan .................................. 62-31426

[51] Int. Cl.$^5$ ............................................. H01L 29/78
[52] U.S. Cl. .................................... 357/23.4; 357/13; 357/23.8
[58] Field of Search ........................ 357/23.4, 23.8, 13

[56] References Cited

U.S. PATENT DOCUMENTS

| | | | |
|---|---|---|---|
| 4,642,674 | 2/1987 | Schoofs | 357/23.8 |
| 4,750,028 | 6/1988 | Ludikhuize | 357/23.8 |
| 4,777,521 | 10/1988 | Coe | 357/23.8 |

Primary Examiner—William D. Larkins
Attorney, Agent, or Firm—Sughrue, Mion, Zinn, Macpeak & Seas

[57] ABSTRACT

A V-MOS FET has a semiconductor body of one conductivity type, a plurality of base regions of the other conductivity type formed in a surface portion of the semiconductor body in a form of matrix having rows and columns, a plurality of source regions of the one conductivity type formed in the base regions, a plurality of auxiliary regions of the other conductivity type formed in the surface portion of said semiconductor body at crossing points of the rows and columns of the base region matrix, a mesh-shape gate electrode formed on region between the source regions to cover the auxiliary regions, a source electrode contacting at least the source regions and a drain electrode contacting a back surface of the semiconductor body.

6 Claims, 2 Drawing Sheets

VERTICAL MOS FIELD EFFECT TRANSISTOR HAVING A HIGH WITHSTAND VOLTAGE AND A HIGH SWITCHING SPEED

This is a continuation of application Ser. No. 07/156,152 filed Feb. 16, 1988, now abandoned.

BACKGROUND OF THE INVENTION

1. Field of the Invention:

The present invention relates to a vertical MOS field effect transistor (hereinafter, refer to V-MOS FET), and more particularly to a structural improvement of the V-MOS FET for high withstand voltage and high switching speed.

2. Description of the Related Art:

The V-MOS FET for high power use has a plurality of N (or P) type base regions at a surface of a P (or N) type drain substrate. P (or N) type source regions are respectively formed in the N (or P) type base regions. A mesh-shape gate is formed on a surface region between the source regions to cover exposed drain region and the base regions between the source regions and the exposed drain region via an insulating gate film. A source electrode is formed on the surface of the substrate to contact with the source and base regions. A drain electrode is formed on a back surface of the substrate.

In response to a signal voltage at the gate electrode, conductive channels are induced at surfaces of the base regions between the source regions and the exposed drain regions. Current flows from the source electrode on the surface to the drain electrode on the back surface through the channels. The V-MOS FET has a very wide channel width to have a large current capacity. Thus, the V-MOS FET is preferable to be used in a high power use.

ON-resistance of the V-MOS FET is primarily determined by a resistivity of drain region between the base regions through which current flows vertically. Therefore, the wider is the interval between the base regions, the smaller is the ON-resistance. On the other hand, the gate electrode operates as a field electrode for extending depletion regions from the base regions when voltage between the source and drain regions becomes large. While the condition where the intervals between the base regions are filled with the depletion regions exhibit the highest withstand voltage, wide interval between the base regions makes the depletion regions separate to decrease the withstand voltage between the source (or base) and drain regions. Thus, the interval between the base regions is determined by a compromise between the ON-resistance and the withstand voltage.

The mesh-shape gate V-MOS FET has a demerit. The interval between the base regions is widest under crossing point between rows and columns of the gate electrode. Therefore, if the intervals between parallel opposing base regions are filled with the depletion region by a high source-drain voltage, the interval between diagonally opposing base regions are not filled with depletion region. The total withstand voltage is determined by that at the intervals between diagonally opposing base regions. In other words, for obtaining a predetermined total withstand voltage, the interval between the diagonally opposing base regions should be selected to have such predetermined withstand voltage. The intervals between parallel opposing base regions become shorter than the interval determined by the predetermined withstand voltage. Thus, ON-resistance which is determined by the intervals between the parallel opposing base regions becomes an unnecessarily high value.

Another demerit of the mesh-shape gate V-MOS FET is a limited maximum operation speed. The gate electrode covers all the surface of the drain substrate exposed from the base regions. This wide coverage produces a large gate-drain stray capacitance. For changing a conductive condition of the V-MOS FET, this gate-drain stray capacitance must be charged or discharged. Due to these charging and discharging, the maximum switching speed is limited to a slow value.

SUMMARY OF THE INVENTION

It is a primary object of the present invention to provide a V-MOS FET having a low ON-resistance with a high withstand voltage.

It is another object of the present invention to provide a V-MOS FET having a high maximum switching speed.

According to the present invention, there is provided a V-MOS FET including a semiconductor substrate of one conductivity type operating as a drain region, a plurality of base regions of the other conductivity type formed at a surface portion of the semiconductor substrate to form a matrix, a plurality of source regions of the one conductivity type each formed in the respective base regions, a plurality of auxiliary regions of the other conductivity type formed at areas of the surface portion of the substrate between diagonally opposing base regions of the matrix without contacting with the base regions, a mesh-shape gate electrode formed on the substrate via an insulating film to cover the interval, the substrate exposed from the base regions, the base regions between the gate region and the exposed substrate and the auxiliary regions, a source electrode connected to at least the source regions, and a drain electrode connected to a back surface of the substrate.

The V-MOS FET has auxiliary regions of the other conductivity type at a surface of the substrate between the diagonally opposing base regions. Due to those auxiliary regions, the surface of the substrate between diagonally opposing base regions is filled with depletion regions extending from the base regions by a source-drain voltage lower than a value required in the case having no auxiliary region. Therefore, the interval between diagonally opposing base region may be made large for the predetermined withstand voltage, resulting in a wide intervals between parallel opposing base regions, and thus in a low ON-resistance. In other words, by the structure designed for a predetermined ON-resistance, a higher withstand voltage may be obtained.

Additionally, since the auxiliary regions has a conductivity opposite to the semiconductor substrate operating as a drain region, the gate-drain stray capacitance lowers by a value corresponding to the area of the auxiliary regions. This decrease in the gate-drain stray capacitance improves a maximum switching speed.

BRIEF DESCRIPTION OF THE DRAWINGS

The above and other object, effect and features will become more apparent from the following description taken in conjunction with accompanying drawings, wherein.

Figure 1A:
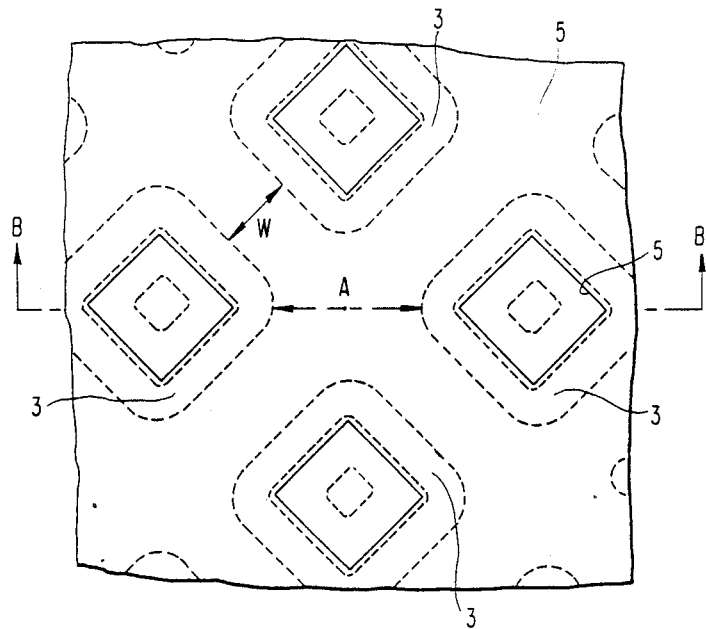
FIG. 1(a) is a plane view of a part of a V-MOS FET in a prior art and FIG. 1(b) is a sectional view taken along B-B of FIG. 1(a)
Figure 1B:
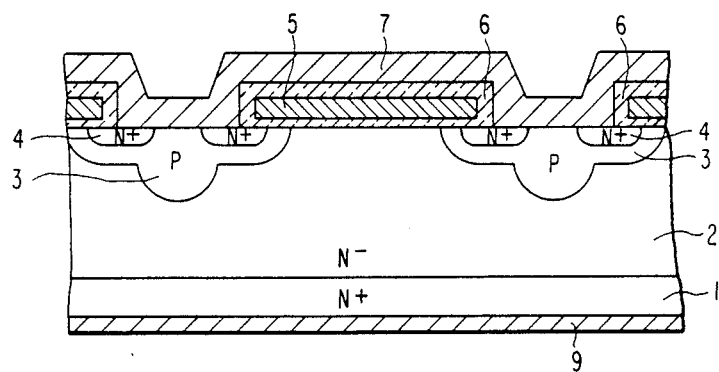

The V-MOS FET in the prior art has a matrix of base regions 3 and a mesh-shape gate electrode 5, as shown in FIGS. 1(a) and 1(b). On an N+ substrate 1, an N− epitaxial layer 2 is formed. Both of N+ substrate 1 and N− epitaxial layer 2 function as a drain region. A drain electrode a is formed on a back surface of the N+ substrate 1. A plurality of P base regions 3 are formed in a surface portion of the N− epitaxial layer to form a matrix of rows and columns. At a center of the respective base regions 3, a P+ region is deeply formed for a contact with a source electrode 7. An N+ ring-shape source region 4 is formed in each base region 3. A mesh-shape gate electrode 5 covers the N− epitaxial layer 2 exposed from the base regions 3 and outer peripheries of the base region between the source regions 4 and the exposed portion of the N− epitaxial layer 2 via a thin gate insulator film. The gate electrode 5 is covered with a relatively thick insulator film 6 which exposes center portions of the base regions 3 and inner portions of the source regions 4. A source electrode 7 covers whole surface of the device to contact the exposed base and source regions 3 and 4 and extend over the insulator film 6.

The interval "A" between diagonally opposing base regions 3 is determined in accordance with an ON-resistance and a withstand voltage of the V-MOS FET. The interval "A", however, is wider than the interval "W" between parallel opposing base regions 3. If the interval "A" is made short to present a predetermined withstand voltage, the interval "W " becomes further short to increase the ON-resistance. On the contrary, if the interval "W" is made wide to show a required ON-resistance, the interval "A" becomes further wide to decrease the withstand voltage. This increment of the withstand voltage based on a fact that a depletion region extending from the base regions 3 cannot fill the wide interval "A". Edge of the depletion region breaks down with lower voltage than other portion of the depletion region. As above-mentioned, the V-MOS FET in the prior art does not have both low ON-resistance and high withstand voltage, or has room for further improvement of withstand voltage.

In addition, the mesh-shape gate electrode 5 widely covers the surface of the N− epitaxial layer 2 except for the base and source regions 3 and 4. This coverage produces a large gate-drain capacitance. Prior to switching, the V-MOS FET has to charge or discharge the large gate-drain capacitance, resulting in a limited maximum switching speed. For example, in a V-MOS FET having an N+ substrate 1 of 0.018 Ω cm, 440 μm thick and a size of 3.83 +4.16 mm², 2 an N− epitaxial layer 2 of 7.5 Ωand 30 μm, base regions of 30×30 μm² 2 and 4 82 m depth and source regions of 1 μm depth, a switching time (td (off)) shows 200 n sec with a drain current of 0.5~1A.

DETAILED DESCRIPTION OF A PREFERRED EMBODIMENT

Figure 2A:
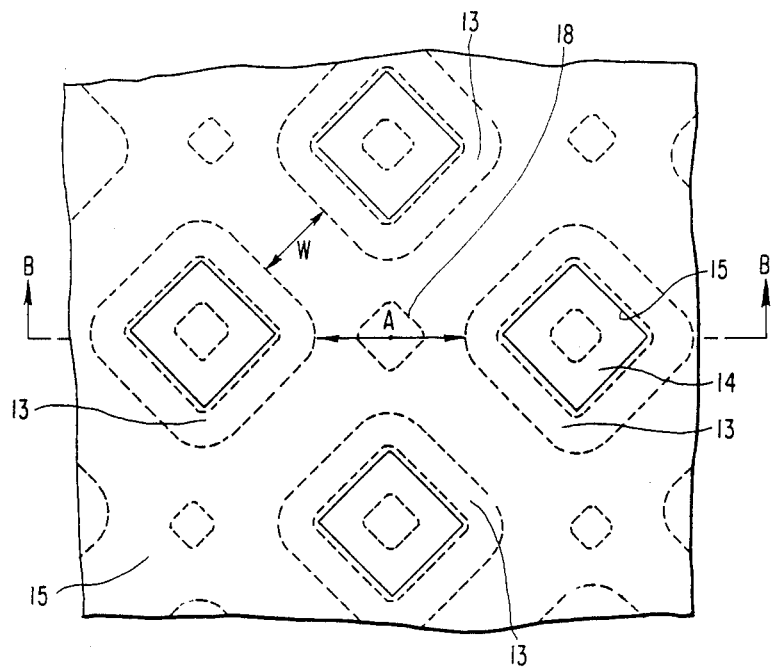
FIG. 2(a) is a plane view of a part of a V-MOS FET according to a preferred embodiment of the present invention.
Figure 2B:
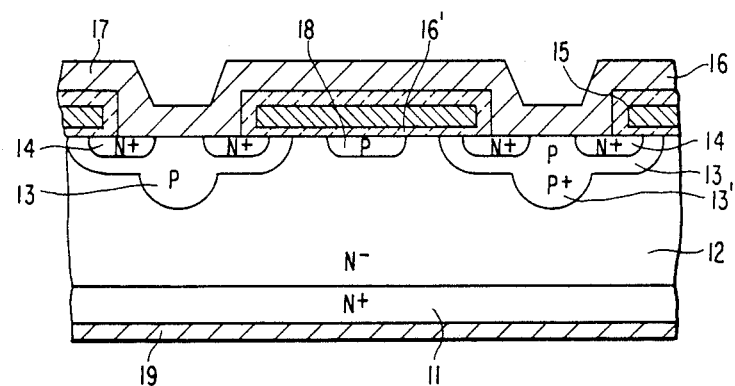
FIG. 2(b) is a sectional view taken along B—B of FIG. 2(a).

A V-MOS FET according to a preferred embodiment shown in FIGS. 2(a) and 2(b) is formed on an N+ Si substrate 11 having a resistivity from 0.005 Ω cm to 0.025 Ω cm (preferably, 0.018 Ωcm) and a thickness of 150~800 μm (preferably, 440 μm). On the substrate 11, there is formed an N− Si epitaxial layer 12 having a resistivity of 0.3 Ω cm to 100 Ω cm (preferably, 7.5 Ωcm) and a thickness of 5~150 μm (preferably, 30 μm). A plurality of P base regions 13 having an area of 30 μm² and a depth of 2~6 μm (preferably, 4 μm) are formed at a surface portion of the N− epitaxial layer 12 by an ion-implantation of a dosage of $2 \times 10^{13} \sim 2 \times 10^{14}$ cm⁻, and an implantation energy of 30 KeV to 200 Kev, to form a matrix. The interval "W" between parallel opposing base regions 13 are selected to a value from 2 μm to 50 μm. A P+ region 13′ is respectively formed at a center of the base regions 13 for electrode contact. A ring-shape source region 14 having a depth of 0.3 μm to 2 μm (preferably, 1 μ) is respectively formed in the base regions 13 by an ion-implantation with a dosage of $5 \times 10^{14}$ cm⁻² to $5 \times 10^{16}$ cm⁻² and an implantation energy of 30 KeV to 200 KeV, to surround the P+ center region 13′ in the respective base regions 13. P auxiliary regions 18 having an area of 8×8 μm² and a depth of 0.2 μm to 6 μm (preferably, 1 μm) are formed at surface portions of the N epitaxial layer 12 between diagonally opposing base regions 13 without contacting with the base regions 13 by an ion-implantation of a dosage of $2 \times 10^{11}$ cm⁻² to $5 \times 10^{16}$ cm⁻² and an implantation energy of 30 KeV to 200 KeV. A mesh-shape gate electrode 15 is formed on the epitaxial layer 12 via a thin gate insulator film 16′ to cover the epitaxial . layer 12 except for the base regions 13 and the auxiliary regions 18, the base regions 13 between the epitaxial layer 12 and the source regions 14 and the auxiliary region 18. The mesh-shape gate electrode 15 is covered with a relatively thick insulator film 16 which exposes the center portions 13′ of the base regions 13 and inner portions of the ring-shape source regions 14. A source electrode 17 covers whole surface of the device to contact the exposed base and source regions 13 and 14 and extend over the thick insulator film 16.

The auxiliary regions 18 are formed of P type regions in the drain N epitaxial layer 12. The depletion regions extending from the P base regions 13 easily reach the auxiliary regions 18 to fill the intervals between the base regions 13 and the auxiliary regions 18. By contacting the depletion region to the auxiliary regions 18, the intervals between diagonally opposing base regions 13 are filled with the depletion regions and the auxiliary regions 18. That is, when a high voltage is applied between source and drain electrodes 17 and 19, electric fields appears in parallel with the surface of the N epitaxial layer 12 to show a high withstand voltage.

More specifically, for obtaining a predetermined high withstand voltage, the interval between diagonally opposing base regions 13 may be widened, compared to the interval having no auxiliary region 18 as in the prior art. This fact also makes widening of the interval "W" between parallel opposing base regions 13 possible to lower the ON-resistance.

For those high withstand voltage and low ON-resistance, the auxiliary regions 18 are formed at respective crossing points between rows and columns of the matrix of base regions 13 so that a corner of the auxiliary region 18 may be within a half of the interval "W" between parallel opposing base regions 13 from a corner of adjacent base region 13. It is needless to say that the auxiliary regions 18 must be separated from the base regions to keep a wide current path. Therefore, the respective auxiliary regions 18 preferably have a quadrilateral shape having sides parallel with rows and columns of the base region matrix and having a corner separated from corner of adjacent base region 13 by a third to a half of the interval "W" between the parallel opposing base regions 13.

The auxiliary regions 18 also have an effect for decreasing the gate-drain stray capacitance. The auxiliary regions 18 has a conductivity opposite to the drain epitaxial layer 12. Therefore, compared to the device having no auxiliary region, the gate-drain stray capacitance is decreased by a value corresponding to an area of the auxiliary regions. Prior to switching, the gate-drain stray capacitance is charged or discharged. The switching speed delayed for a time required for the charging or discharging. The output pulse waveform deforms by the delayed switching speed. However, in the V-MOS FET of the embodiment of the present invention, the switching speed is improved by the decrement of the gate-drain stray capacitance. In fact, the switching speed (td(off)) is improved from 200 n sec to 100 n sec by insertion of the auxiliary regions 18 having an area of $8 \times 8$ $\mu m^2$ and a depth of 1 $\mu m$ in a V-MOS FET having an N+ substrate 11 of $3.84 \times 4.16$ $mm^2$ in chip size, 0.018 $\Omega cm$ in resistivity and 440 $\Omega m$ in thickness, an N− epitaxial layer 12 of 7.5 $\Omega cm$ in resistivity and 30 $\Omega m$ in thickness, base regions 13 of $30 \times 30$ $\mu m^2$ in area an 4 $\mu m$ in depth and source regions 14 of 1 $\mu m$ in depth.

The auxiliary regions 18 may be interposed between parallel opposing base regions 13. This modification, however, is not effective, because the ON-resistance is increased and/or enlarged chip area is required by such insertion of the auxiliary regions 18. Therefore, the position for the auxiliary regions 18 had better be limited at the crossing points between rows and columns of the base region matrix.

What is claimed is:

1. A semiconductor device comprising:
   a drain region of one conductivity type which is a semiconductor substrate having a main surface and a back surface;
   a plurality of base regions of the other conductivity type formed in said drain region from said main surface;
   a plurality of source regions of said one conductivity type formed in said base regions, respectively, to define channel regions at peripheries of said base regions, said channel regions having a first depth;
   a plurality of auxiliary regions of said other conductivity type formed in said drain region from said main surface between said base regions, said auxiliary regions being separated from said base regions and having a second depth shallower than said first depth;
   a gate insulator film formed on said main surface to cover said auxiliary regions, said channel regions and said drain regions between said auxiliary regions and said channel regions;
   a gate electrode formed on said gate insulator film;
   a source electrode contacting at least said source regions; and
   a drain electrode attached to said base surface of said semiconductor substrate.

2. A semiconductor device as claimed in claim 1 wherein said base regions are arranged in a form of matrix having rows and columns, said auxiliary regions being formed at portions crossing said rows and said columns of said base region matrix.

3. A semiconductor device as claimed in claim 2, wherein said auxiliary regions have a shape of quadrilateral having sides parallel with said rows and columns of said base region matrix.

4. A semiconductor device as claimed in claim 3, wherein respective corners of said auxiliary regions are in a position which has a distance within a half of an interval between parallel opposing base regions from corners of said base region nearest to the respective corners of said auxiliary region.

5. A semiconductor device as claimed in claim 4, wherein said respective corners of said auxiliary regions are separated from the corners of said base region nearest to the respective corners of said auxiliary regions with at least a third of said interval between said parallel opposing base regions.

6. A semiconductor device as claimed in claim 5, wherein said gate electrode has a mesh-shape.

* * * * *

UNITED STATES PATENT AND TRADEMARK OFFICE
CERTIFICATE OF CORRECTION

PATENT NO. : 4,965,647
DATED : October 23, 1990
INVENTOR(S) : Mitsuasa Takahashi It is certified that error appears in the above-identified patent and that said Letters Patent is hereby corrected as shown below:

In Column 3, line 55, delete "+", and insert --x--;

In Column 3, line 56, delete "2";

In Column 3, line 57, delete "2"; and

In Column 3, line 57, delete "82m", and insert --$\mu$m--;

In Column 5, line 19, delete "Ωm", and insert --$\mu$m--; and

In Column 5, line 21, delete "Ωm", and insert --$\mu$m--.

Signed and Sealed this

Twenty-eighth Day of July, 1992

Attest:

DOUGLAS B. COMER

*Attesting Officer*     *Acting Commissioner of Patents and Trademarks*